(12) United States Patent
Chahal

(10) Patent No.: US 8,344,430 B2
(45) Date of Patent: Jan. 1, 2013

(54) MULTIPLE SUBSTRATE ELECTRICAL CIRCUIT DEVICE

(75) Inventor: Premjeet Chahal, Plano, TX (US)

(73) Assignee: Raytheon Company, Waltham, MA (US)

( * ) Notice: Subject to any disclaimer, the term of this patent is extended or adjusted under 35 U.S.C. 154(b) by 176 days.

(21) Appl. No.: 12/914,457

(22) Filed: Oct. 28, 2010

(65) Prior Publication Data

US 2011/0037151 A1 Feb. 17, 2011

Related U.S. Application Data

(62) Division of application No. 11/845,510, filed on Aug. 27, 2007, now Pat. No. 7,825,005.

(51) Int. Cl.
*H01L 29/80* (2006.01)
(52) U.S. Cl. .......... 257/275; 257/728; 438/455
(58) Field of Classification Search .......... 257/275, 257/625, 728, E21.705; 438/128, 455, 51, 438/55, 669, 109, 928
See application file for complete search history.

(56) References Cited

U.S. PATENT DOCUMENTS

| | | | |
|---|---|---|---|
| 6,195,047 B1 | 2/2001 | Richards | 343/700 MS |
| 6,448,641 B2 * | 9/2002 | Ker et al. | 257/700 |
| 6,984,852 B2 * | 1/2006 | Wang et al. | 257/99 |
| 7,164,197 B2 * | 1/2007 | Mao et al. | 257/700 |

* cited by examiner

*Primary Examiner* — David Vu
(74) *Attorney, Agent, or Firm* — Cantor Colburn LLP

(57) ABSTRACT

In one embodiment of the disclosure, a method includes providing a carrier substrate, forming a first region over an upper surface of the substrate, creating an electrical component using a planar process, embedding the electrical component in the dielectric layer, and removing a substrate portion of the electrical component. The first region includes a dielectric layer and may be made of any material that electrically isolates the electrical component from the carrier substrate. The electrical component may be created using a planar process thereby having an epitaxial surface that is embedded in the dielectric layer.

9 Claims, 3 Drawing Sheets

MULTIPLE SUBSTRATE ELECTRICAL CIRCUIT DEVICE

RELATED APPLICATIONS

This application is a divisional of application Ser. No. 11/845,510 filed Aug. 27, 2007, entitled "Multiple Substrated Electrical Circuit Device," now U.S. Pat. No. 7,825,005.

TECHNICAL FIELD OF THE DISCLOSURE

This disclosure relates to electrical circuit devices, and more particularly, to a multiple substrate electrical circuit device and method of manufacturing the same.

OVERVIEW OF THE DISCLOSURE

Monolithic microwave integrated circuit (MMIC) devices are a type of integrated circuit (IC) device that process electrical signals at microwave frequencies. Monolithic microwave integrated circuit devices may process analog as well as digital signals in order to provide a wide array of useful applications, such as cellular communications or other microwave communication technologies. Due to performance requirements at these microwave frequencies, monolithic microwave integrated circuit devices are typically formed on high performance substrates, such as gallium-arsenide, indium-phosphide, indium-nitride, or other similar substrate materials having a relatively low noise floor and high current density.

SUMMARY OF THE DISCLOSURE

In one embodiment of the disclosure, a method includes providing a carrier substrate, forming a first region over an upper surface of the substrate, creating an electrical component using a planar process, embedding the electrical component in the dielectric layer, and removing a substrate portion of the electrical component. The first region includes a dielectric layer and may be made of any material that electrically isolates the electrical component from the carrier substrate. The electrical component may be created using a planar process thereby having an epitaxial surface that is embedded in the dielectric layer.

In another embodiment of the disclosure, a semiconductor device includes a carrier substrate, a dielectric layer, and a planarized electrical component. The dielectric layer is disposed over an upper surface of the carrier substrate. The electrical component is embedded in the dielectric layer and physically isolated from any substrate.

Some embodiments of the present disclosure may provide numerous technical advantages. A technical advantage of one embodiment may include an electrical circuit device that may utilize multiple substrate technologies. While various substrate materials, such as silicon, germanium, gallium-arsenide, and the like may each exhibit differing characteristics, the teachings of the present disclosure may allow combinations of these various substrate technologies in order to further enhance the utility that the electrical circuit may provide.

While specific advantages have been disclosed hereinabove, it will be understood that various embodiments may include all, some, or none of the disclosed advantages. Additionally, other technical advantages not specifically cited may become apparent to one of ordinary skill in the art following review of the ensuing drawings and their associated detailed description.

BRIEF DESCRIPTION OF THE DRAWINGS

A more complete understanding of various embodiments will be apparent from the detailed description taken in conjunction with the accompanying drawings in which.

DETAILED DESCRIPTION OF EXAMPLE EMBODIMENTS

As mentioned previously, monolithic microwave integrated circuit (MMIC) devices are typically formed of high performance substrates in order to provide adequate performance at microwave frequencies. Nevertheless, many applications for monolithic microwave integrated circuit devices may utilize circuitry where the level of performance provided by these high performance substrates are not necessary. For example, a cellular telephone circuit having microwave circuitry may also include digital logic to administer the various features available on the telephone. Thus, it would be beneficial to provide a multiple substrate electrical circuit that may utilize the high performance substrates in conjunction with other cost effective substrates, such as silicon or germanium.

Figure 1:
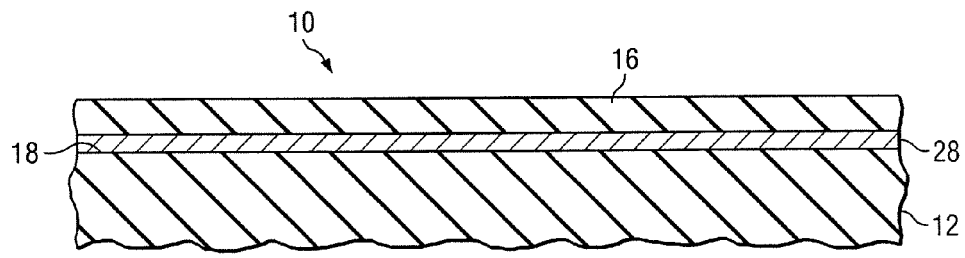
FIG. 1 is a side elevation, cross-sectional view of a dielectric layer and conductive layer that are formed over the upper surface of a carrier substrate according to one embodiment of a multiple substrate electrical circuit device.

FIGS. 1 through 6 are cross-sectional drawings shown during various phases of manufacture showing one embodiment of a sequence of actions that may be performed to create a multiple substrate electrical circuit device 10. A carrier substrate 12 may be provided as illustrated in FIG. 1. Carrier substrate 12 may be any suitable semi-conductor material, such as silicon (Si), gallium-arsenide (GaAs), Indium-Nitride (InN), germanium (Ge), silicon-germanium (SiGe) silicon-carbide (SiC), or indium-phosphide (InP). In one embodiment, carrier substrate 12 may be formed into an integrated circuit such that one or more electrical circuit devices are formed on its upper surface 18.

A dielectric layer 16 and conductive layer 28 may then be formed over the upper surface 18 of carrier substrate 12. Conductive layer 28 may be disposed over the upper surface 18 prior to forming dielectric layer 16 in order to electrically isolate electrical component 14 from carrier substrate 12. In one embodiment, conductive layer 28 may be made of any suitable conductive material, such as metal in order to serve as a ground plane to electrically isolate circuitry on carrier substrate 12. In another embodiment, a second dielectric layer may be disposed in between the conductive layer 28 and upper surface 18 in order to provide electrical isolation of the conductive layer 28 from the circuitry on the upper surface 18.

Dielectric layer 16 may be formed of any suitable material. In one embodiment, dielectric layer 16 may include a number of layers, each comprising a differing material. In another embodiment, dielectric layer 16 may include a number of layers such that one or more of the layers includes various passive electrical components, such as resistors, capacitors, or inductors.

Figure 2:
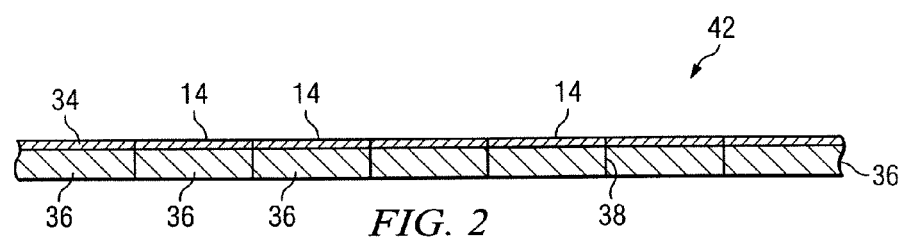
FIG. 2 shows an intermediate structure, separate from the carrier substrate of FIG. 1, having a number of electrical components that have been created using any suitable planar process.

FIG. 2 shows an intermediate structure 42, separate from the carrier substrate 12 of FIG. 1, having a number of electrical components 14 that have been created using any suitable planar process. Multiple electrical components 14 are formed on an epitaxial surface 34 in a side-by-side configuration on a substrate portion 36. Electrical components 14 may be any type of component, such as a bipolar transistor, field-effect transistor (FET), resistor, or capacitor and may be formed through the result of a planar process. Electrical components 14 may be formed from any suitable semi-conductor material, such as silicon (Si), gallium-arsenide (GaAs), Indium-Nitride (InN), germanium (Ge), silicon-germanium (SiGe) silicon-carbide (SiC), or indium-phosphide (InP). Interface regions 38 are included to illustrate demarcation regions where individual electrical components 14 may be separated from one another.

In one embodiment, the material from which the electrical component 14 is formed may be independent of the material from which the carrier substrate 12 is formed. That is, the material of the electrical component 14 may be different from the material of the carrier substrate 12. Certain embodiments may provide an advantage in that multiple semiconductor technologies may be combined into an electrical circuit having a relatively small size. For example, multiple substrate electrical circuit device 10 may be a monolithic microwave integrated circuit (MMIC) in which carrier substrate 12 may be made of silicon for processing of digital logic signals and electrical component 14 may be made of gallium-arsenide for processing of microwave frequency signals. Thus, in this particular example, a high performance gallium-arsenide electrical component 14 such as a transistor may be used in conjunction with a relatively low cost silicon carrier substrate 12 in order to combine the inherent strengths of both types of substrate materials.

Figure 3:
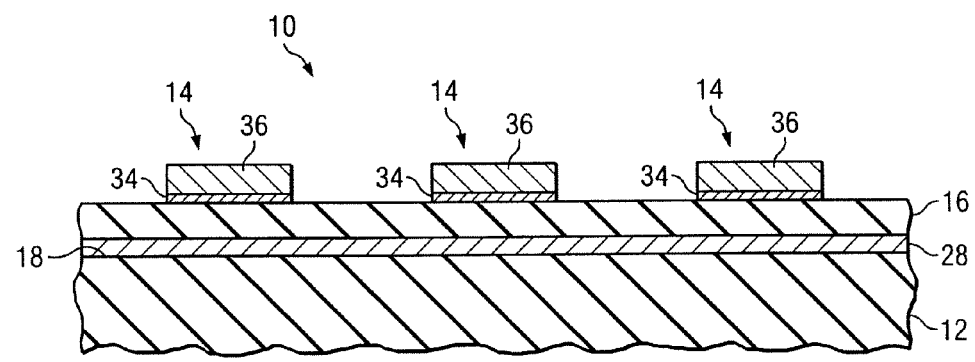
FIG. 3 shows the carrier substrate of FIG. 1 and several electrical components from intermediate structure of FIG. 2 that are attached to the dielectric layer.
Figure 4:
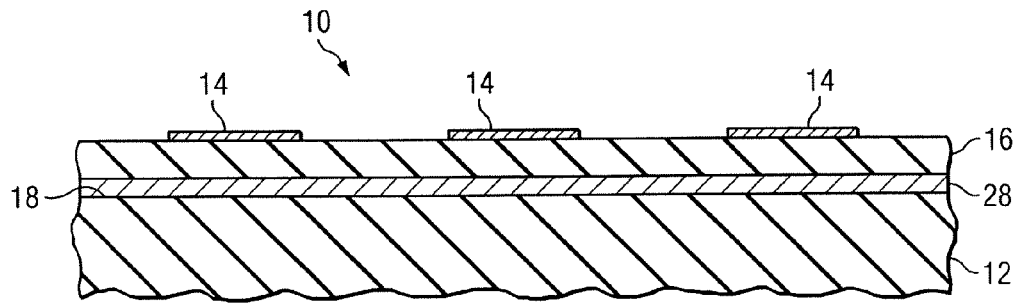
FIG. 4 shows the structure of FIG. 3 in which substrate portions of the electrical components have been removed.

FIG. 3 shows carrier substrate 12 and several electrical components 14 from intermediate structure 42 that have been separated from one another along interface regions 38. The epitaxial surface 34 of electrical components 14 may be embedded in dielectric layer 16 such that substrate portion 36 of electrical component 14 faces away from dielectric layer 16. Next, substrate portion 36 may be physically isolated from substrate portion 36 by removing substrate portion 36 from electrical component 14 as shown in FIG. 4. Substrate portion 36 may be removed from electrical component 14 using any suitable approach. In one embodiment, substrate portion 36 may be removed using known chemical etching techniques. Certain embodiments may provide an advantage in that processing the electrical component 14 in this manner allows thinning of substrate portion 36 without the need for special handling procedures and allows for implementation of heat conducting devices, such as thermal bars (to be described in detail below).

Electrical components 14 may thus be disposed proximate the carrier substrate 12 by dielectric layer 16. Dielectric layer 16 may be made of any material that provides electrical isolation of electrical component 14 from carrier substrate 12. In one embodiment, dielectric layer 16 may be made of a material that does not cause undue mechanical interface stress between electrical component 14 and carrier substrate 12 throughout their anticipated thermal temperature ranges. That is, dielectric layer 16 may have sufficient elasticity to compensate for expansion or contraction of electrical component 14 or carrier substrate 12 due to each of their coefficient of thermal expansion (CTE) factors.

In one embodiment, dielectric layer 16 may be made of liquid crystal polymer (LCP). Liquid crystal polymer is a material that allows for relatively fine control over the thickness of the dielectric layer 16 and is stable over a wide temperature range. Thus, multiple substrate electrical circuit device 10 may be configured to have relatively stable physical operating properties by being formed of liquid crystal polymer. Liquid crystal polymer also has a relatively low dielectric constant. The teachings of the present disclosure recognize that materials in close proximity to electrical component 14 may exhibit an adverse effect upon performance due to parasitic capacitance. Thus, certain embodiments utilizing a dielectric layer 16 made of liquid crystal polymer may alleviate the adverse effect of parasitic capacitance by having a relatively low dielectric constant.

Figure 5A:
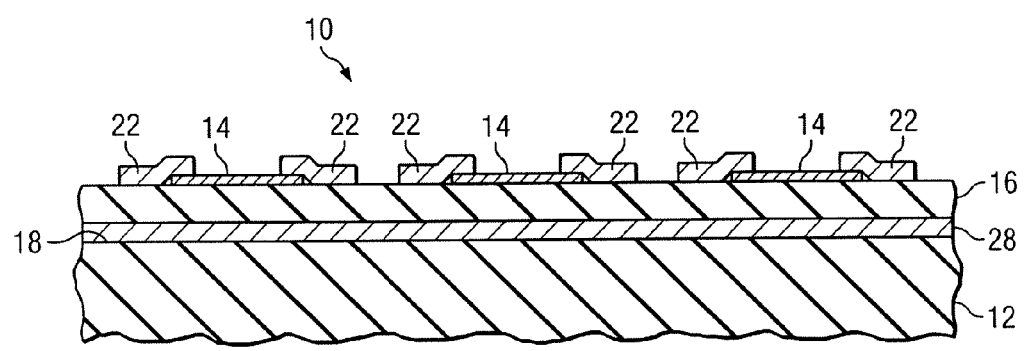
FIG. 5A shows structure of FIG. 4 in which microstrip lines are interconnected to several electrical components.
Figure 5B:
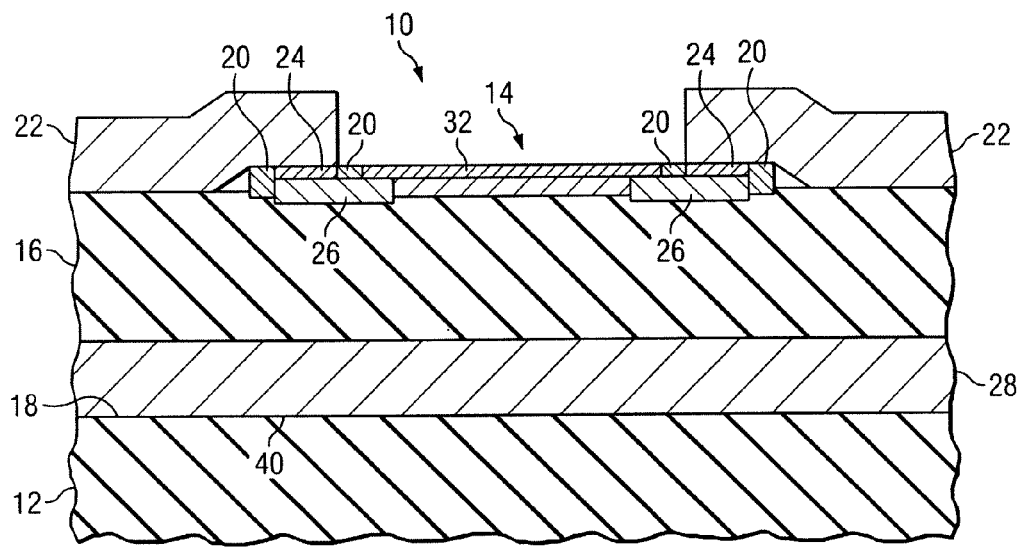
FIG. 5B is an enlarged elevational view of FIG. 5A showing one electrical component that is attached to dielectric layer.

FIG. 5A shows multiple substrate electrical circuit device 10 of FIG. 4 in which microstrip lines 22 are interconnected to several electrical components 14. In one embodiment, microstrip lines 22 may be used to provide electrical interconnection of electrical components 14 to other components. For example, although not shown, microstrip lines 22 may be provided to interconnect electrical components 14 to circuitry on carrier substrate 12. In another embodiment, microstrip lines 22 may be an antenna that is configured to radiate electro-magnetic energy. In yet another embodiment, electrical component 14 may be a diode and microstrip line 22 may be an antenna that function together as a radio frequency (RF) detector. FIG. 5B is an enlarged elevational view showing one electrical component 14 that is attached to dielectric layer 16.

The electrical component 14 may be electrically connected to microstrip lines 22 by vias 24. Interconnect pads 26 may be provided with electrical component 14 to allow attachment of the electrical component 14 to vias 24. In one embodiment, a second dielectric layer 20 may be formed proximate the interconnect pads 26 to control stray capacitance between the microstrip lines 22 and the electrical component 14.

Figure 6A:
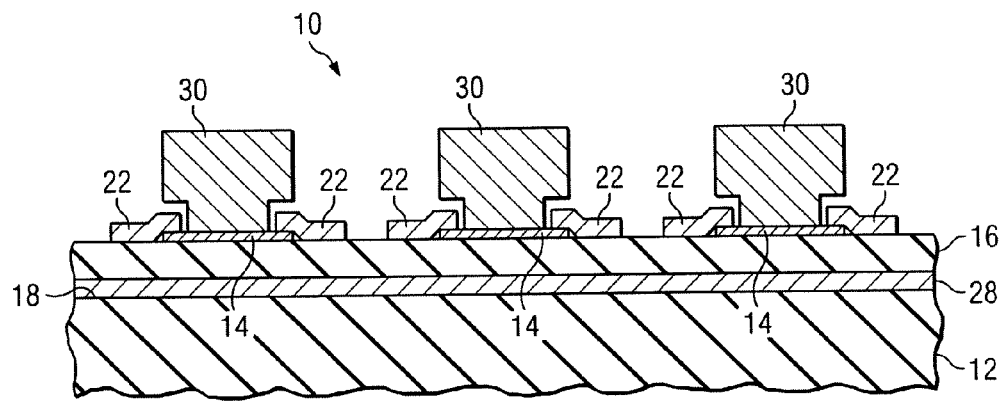
FIG. 6A shows the structure of FIG. 5A in which thermal bars are attached to electrical components.
Figure 6B:
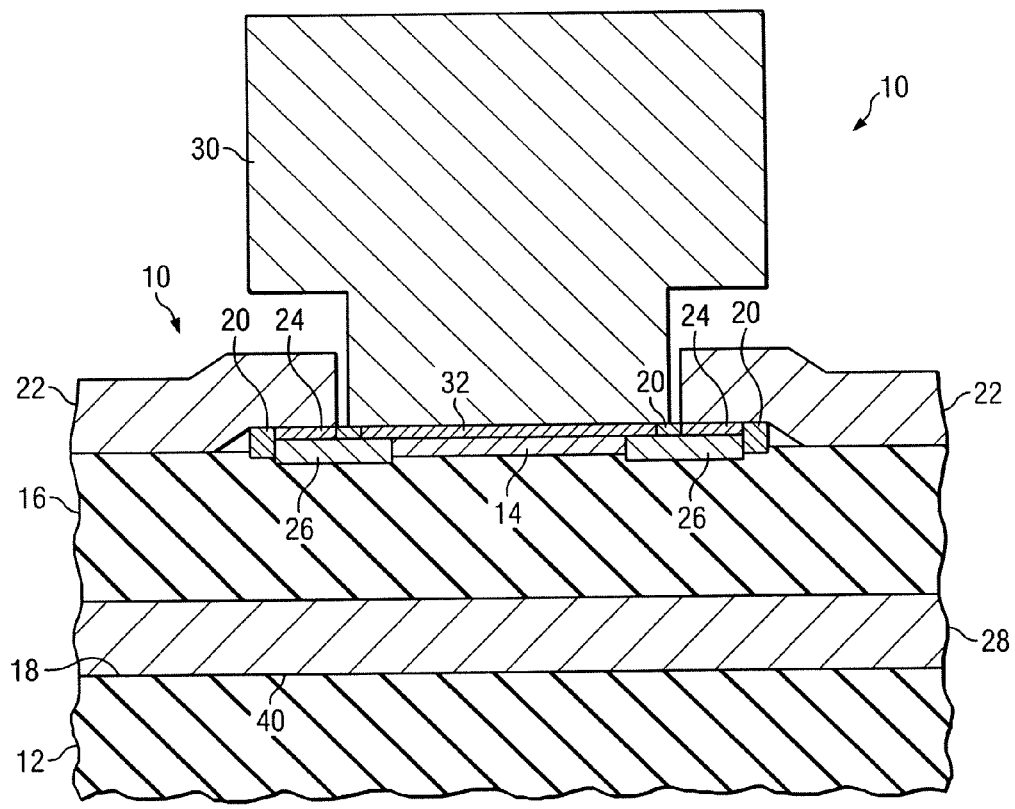
FIG. 6B is an enlarged elevational view of FIG. 6A showing one thermal bar that is attached to electrical component.

Thermal bars 30 may be disposed on electrical components 14 as shown in FIG. 6A. An enlarged elevational view showing one thermal bar 30 that is attached to electrical component 14 is shown in FIG. 6B. Thermal bars 30 may be disposed on electrical component 14 using any suitable approach. In one embodiment, thermal bar 30 may be grown on electrical component 14. Thermal bar 30 may provide for the efficient removal of heat in certain embodiments. The thermal bar 30 may provide improved conduction of heat away from electrical component 14 than otherwise would have been provided by substrate portion 36 from which the electrical component 14 was formed. The thermal bar 30 may also be operable to hermetically seal electrical component 14 from the detrimental effects of the ambient environment, such as moisture or airborne debris.

Multiple substrate electrical circuit device 10 provides for implementation of differing substrate technologies on a single carrier substrate 12. Using these differing substrate technologies, applications for the multiple substrate electrical circuit device 10 may be realized having enhanced performance at a relatively lower cost. Attachment of electrical components 14 to carrier substrate 12 prior to removal of substrate portion 36 may also alleviate handling problems inherent in known semiconductor thinning techniques.

Removal of substrate portion 36 from the electrical component 14 may also allow implementation of thermal bars 30 to efficiently dissipate heat. Thus, the described multiple substrate electrical circuit device 10 may provide several performance advantages at a relatively reduced cost.

Although the present disclosure has been described in several embodiments, a myriad of changes, variations, alterations, transformations, and modifications may be suggested to one skilled in the art, and it is intended that the present disclosure encompass such changes, variations, alterations, transformations, and modifications as falling within the spirit and scope of the appended claims.

What is claimed is:

1. A semiconductor device comprising:
   a carrier substrate of a first semiconductor material having a first upper surface;
   a dielectric layer having a second upper surface that is disposed over the first upper surface; and
   an epitaxial surface of a second semiconductor material embedded in the second upper surface of the dielectric layer and electrically isolated from the carrier substrate, the epitaxial surface of the second semiconductor material having a planarized electrical component formed therein.

2. The semiconductor device of claim 1, wherein the carrier substrate is an integrated circuit.

3. The semiconductor device of claim 2, wherein the electrical component is electrically connected to the integrated circuit using a microstrip line.

4. The semiconductor device of claim 1, wherein the dielectric layer is made of liquid crystal polymer.

5. The semiconductor device of claim 1, further comprising a conductive layer in between the first upper surface and the dielectric layer.

6. The semiconductor device of claim 1, wherein the electrical component is a type of electrical device selected from the group consisting of a field effect transistor, a bi-polar transistor, a resistor, and a capacitor.

7. The semiconductor device of claim 1, further comprising a thermal bar that is attached to the electrical component.

8. The semiconductor device of claim 1, wherein the second semiconductor material is selected from the group consisting of silicon (Si), gallium-arsenide (GaAs), Indium-Nitride (InN), germanium (Ge), silicon-carbide (SiC), or indium-phosphide (InP).

9. The semiconductor device of claim 1, wherein the first semiconductor material is different from the second semiconductor material.

* * * * *